United States Patent
Takagi

(10) Patent No.: US 10,108,098 B2
(45) Date of Patent: Oct. 23, 2018

(54) LITHOGRAPHY APPARATUS, CONTROL METHOD THEREFOR, AND METHOD OF MANUFACTURING ARTICLE

(71) Applicant: CANON KABUSHIKI KAISHA, Tokyo (JP)

(72) Inventor: Atsushi Takagi, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/472,403

(22) Filed: Mar. 29, 2017

(65) Prior Publication Data

US 2017/0285491 A1    Oct. 5, 2017

(30) Foreign Application Priority Data

Mar. 30, 2016  (JP) .................................. 2016-069279

(51) Int. Cl.
| | |
|---|---|
| G03B 27/32 | (2006.01) |
| G03B 27/58 | (2006.01) |
| G03B 27/62 | (2006.01) |
| H02K 41/02 | (2006.01) |
| G03F 9/00 | (2006.01) |
| H01L 21/68 | (2006.01) |
| G03F 7/20 | (2006.01) |

(52) U.S. Cl.
CPC ........ G03F 9/7011 (2013.01); G03F 7/70625 (2013.01); G03F 7/70725 (2013.01); G03F 9/7015 (2013.01); H01L 21/682 (2013.01)

(58) Field of Classification Search
CPC ............. G03F 7/70716; G03F 7/70625; G03F 7/70725; G03F 9/7007; G03F 9/7011; G03F 9/7015; G03F 9/7019
USPC ........................ 310/12.06; 355/52, 72, 75, 77
See application file for complete search history.

(56) References Cited

FOREIGN PATENT DOCUMENTS

| | | |
|---|---|---|
| JP | H09-246168 A | 9/1997 |
| JP | 2015231035 A | 12/2015 |

*Primary Examiner* — Colin Kreutzer
(74) *Attorney, Agent, or Firm* — Rossi, Kimms & McDowell LLP

(57) ABSTRACT

A lithography apparatus includes an original holder configured to hold and move an original, a measurement unit configured to measure a misalignment amount of the original with respect to the original holder, and a controller configured to control movement of the original holder. The controller repeatedly performs preliminary driving for moving the original holder before performing the pattern formation. At this time, if the misalignment amount measured by the measurement unit converges to a predetermined convergence value while the preliminary driving is repeatedly performed, the controller ends the preliminary driving.

12 Claims, 5 Drawing Sheets

LITHOGRAPHY APPARATUS, CONTROL METHOD THEREFOR, AND METHOD OF MANUFACTURING ARTICLE

BACKGROUND OF THE INVENTION

Field of the Invention

The present invention relates to a lithography apparatus, a control method therefor, and a method of manufacturing an article.

Description of the Related Art

In the field of a lithography apparatus such as an exposure apparatus, requirements for the resolution of a pattern to be formed and the accuracy of patterning are growing year by year, and a deviation between an original or substrate and a holder for holding it cannot be ignored. For example, an article such as an original or substrate held on a stage has a stress applied by acceleration and an inertial force acts at the time of scan driving, thereby generating a deviation with respect to the stage depending on the relationship with a friction force. If the deviation varies depending on the driving direction, a so-called direction difference misalignment occurs, thereby causing a shot arrangement error at the time of exposure. Japanese Patent Laid-Open No. 09-246168 discloses a technique of detecting misalignment with respect to a reticle stage, which occurs due to acceleration/deceleration during scanning exposure, and correcting it.

The misalignment with respect to the stage of the article such as an original or substrate includes not only misalignment occurring during scanning exposure but also misalignment such as a chucking error occurring at the early stage of mounting of the article on the stage. It is known that this kind of misalignment converges as scan driving of the stage is repeated. Japanese Patent Laid-Open No. 2015-231035 discloses a technique of driving, in advance, a reticle stage a plurality of times so that the misalignment of the reticle with respect to the reticle stage converges.

In fact, however, the coupling state between the reticle and the reticle stage varies under various conditions but the technique described in Japanese Patent Laid-Open No. 2015-231035 does not control the scan driving count of the reticle stage in terms of that point. There is room for improvement against reduction in throughput.

SUMMARY OF THE INVENTION

The present invention provides, for example, a technique advantageous in compatibility between the throughput and reduction of a mounting error of an article.

According to one aspect of the present invention, a lithography apparatus for performing pattern formation by transferring a pattern of an original onto a substrate is provided. The apparatus comprises an original holder configured to hold and move the original, a measurement unit configured to measure a misalignment amount of the original with respect to the original holder, and a controller configured to control movement of the original holder, wherein the controller repeatedly performs preliminary driving for moving the original holder before performing the pattern formation, and controls the movement of the original holder so as to end the preliminary driving if the misalignment amount measured by the measurement unit converges to a predetermined convergence value while the preliminary driving is repeatedly performed.

Further features of the present invention will become apparent from the following description of exemplary embodiments (with reference to the attached drawings).

DESCRIPTION OF THE EMBODIMENTS

Various exemplary embodiments, features, and aspects of the invention will be described in detail below with reference to the drawings.

An embodiment of the present invention will be described in detail below with reference to the accompanying drawings. Note that the following embodiment is not intended to limit the present invention and is merely a concrete example in practicing the invention. In addition, not all combinations of features to be described in the embodiment are indispensable for the means to solve the problems according to the present invention.

Figure 1:
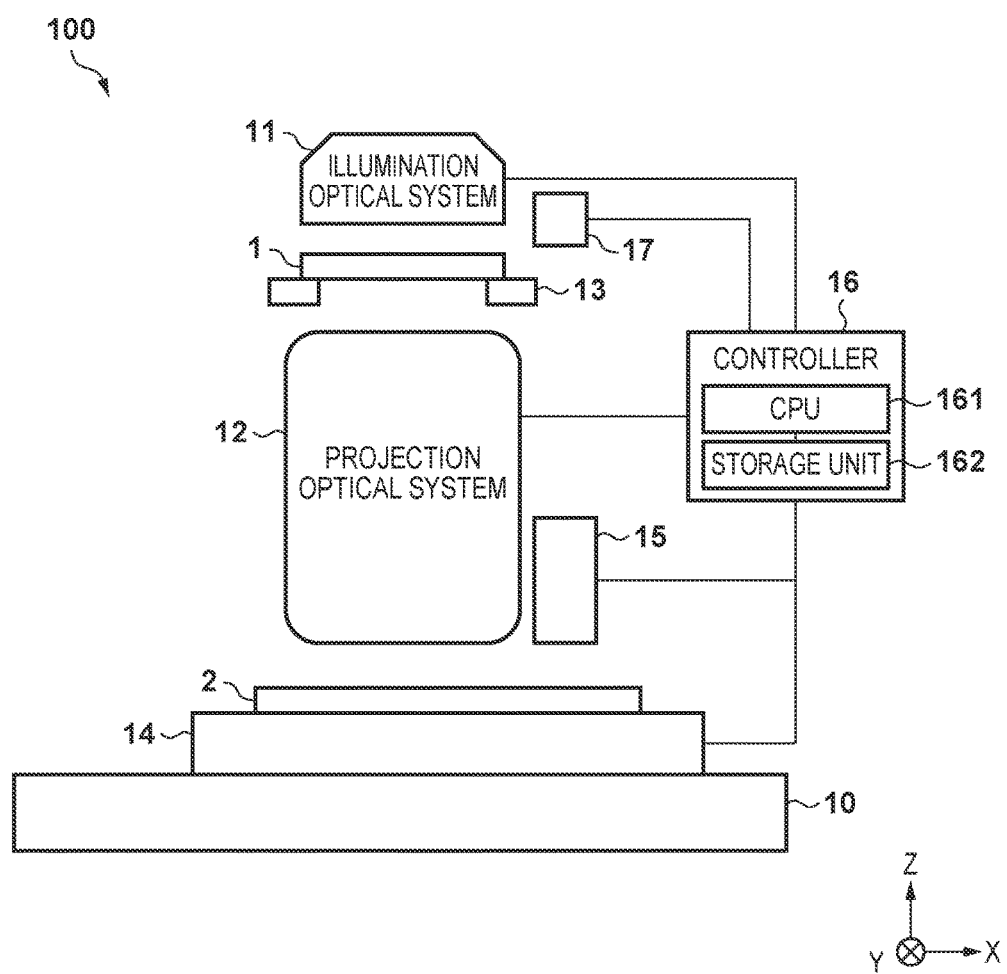
FIG. 1 is a schematic view showing an exposure apparatus according to an embodiment.

In the following embodiment, as an example of a lithography apparatus, an exposure apparatus for exposing a photosensitive substrate via an original and a projection optical system will be described. FIG. 1 is a schematic view showing the arrangement of an exposure apparatus 100 according to the embodiment. The exposure apparatus 100 is, for example, a scanning exposure apparatus for exposing a substrate 2 by scanning an original 1 and the substrate 2 with respect to a projection optical system 12. A controller 16 includes, for example, a CPU 161 and a storage unit 162 (memory), and controls processing of transferring a pattern formed on the original 1 (reticle) onto the substrate 2 (wafer) (processing of exposing the substrate 2). An illumination optical system 11 illuminates the original 1 held by an original holder 13 using light emitted from a light source (not shown). The projection optical system 12 projects the pattern formed on the original 1 onto the substrate 2 at a predetermined magnification (for example, ½). The original 1 and the substrate 2 are held by the original holder 13 and a substrate holder 14, respectively, and are arranged at optically almost conjugate positions via the projection optical system 12 (on the object plane and image plane of the projection optical system 12). The original holder 13 holds the original 1 by, for example, vacuum chuck, electrostatic chuck, or the like, and is configured to be movable in, for example, the X and Y directions. The substrate holder 14 holds the substrate 2 by, for example, vacuum chuck, electrostatic chuck, or the like, and is configured to be movable in, for example, the X and Y directions.

Figure 2:
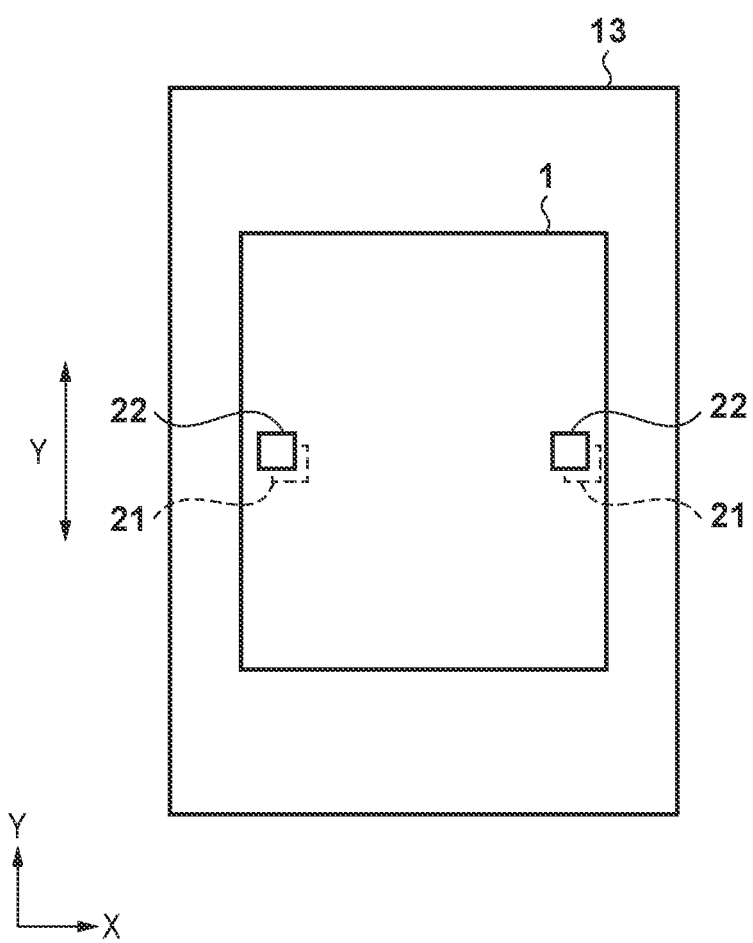
FIG. 2 is a schematic view showing an original and alignment marks.

An original misalignment detector 17 detects alignment marks 21 formed on the original holder 13 and alignment marks 22 formed on the original 1, as shown in FIG. 2. The controller 16 can measure the misalignment amount of the original 1 with respect to the original holder 13 by calculating the relative positions between the alignment marks. In this embodiment, a measurement unit for measuring the misalignment amount of the original is formed by the original misalignment detector 17 and the controller 16. As shown in FIG. 2, it is possible to measure the misalignment amount of the original in the X, Y, and θ directions with respect to the original holder 13 by having the plurality of alignment marks 21 of the original holder 13 and the plurality of alignment marks 22 of the original 1 in the X direction.

Figure 3:
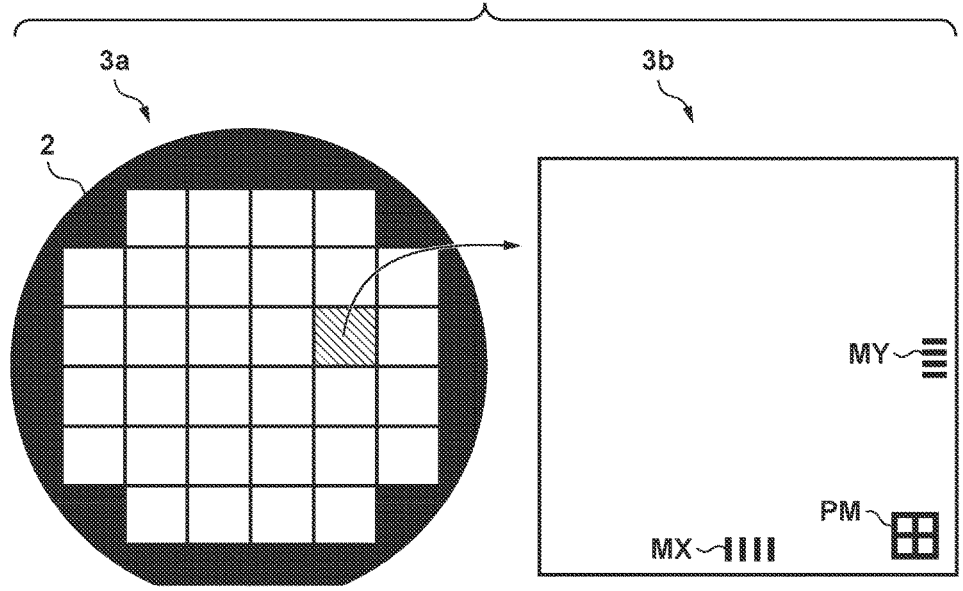
FIG. 3 is a schematic view showing a substrate and alignment marks.

A substrate misalignment detector 15 detects a plurality of alignment marks provided on a plurality of predetermined sample shots formed on the substrate. This obtains the positions of the sample shots. FIG. 3 is a schematic view showing the substrate 2 and the alignment marks. FIG. 3 shows an array 3a of chips formed on the substrate 2 and an enlarged view 3b of one chip. With respect to the plurality of predetermined sample shots, the substrate holder 14 is driven so that a plurality of alignment marks MX, MY, and PM provided in a circuit pattern are located in the detection region of the substrate misalignment detector 15. After that, the substrate misalignment detector 15 detects the position of each alignment mark, and the controller 16 measures the misalignment amount of the substrate 2 with respect to the substrate holder 14. As described above, in this embodiment, the measurement unit for measuring the misalignment amount of the substrate is formed by the substrate misalignment detector 15 and the controller 16.

Note that in FIG. 1, each of the original misalignment detector 17 and the substrate misalignment detector 15 is provided as an off-axis detector for detecting the alignment marks without intervention of the projection optical system 12. The present invention, however, is not limited to this. For example, each of the original misalignment detector 17 and the substrate misalignment detector 15 may be provided as a TTL (Through The Lens) detector for detecting the alignment marks via the projection optical system 12.

The arrangement of the exposure apparatus according to this embodiment is generally as described above. A measure against the misalignment of the original 1 (article) with respect to the original holder 13 according to this embodiment will be described next. The original holder 13 holds (chucks) the original 1 by vacuum chuck, electrostatic chuck, or the like. When the original 1 is chucked on the original holder 13, the initial coupling state between the original 1 and the original holder 13 is unstable, thus causing a chucking error. According to examinations, it is known that the coupling state becomes stable as driving of the substrate in scanning exposure is repeated, and the chucking error decreases, and converges to a predetermined value.

In this embodiment, every time the substrate is mounted on the original holder 13, preliminary driving for moving the original holder 13 is repeatedly performed. Preliminary driving may be preliminary scan driving for causing the original holder 13 to reciprocate within a moving range at the time of scanning exposure. Preliminary scan driving may be, for example, scan driving (dummy scan) under conditions which are the same as or similar to those at the time of actual scanning exposure except that no exposure is performed. By repeatedly performing such preliminary scan driving, the initial unstable coupling state between the original 1 and the original holder 13 becomes stable, and the mounting error (misalignment amount) such as a chucking error is reduced.

Figure 4:
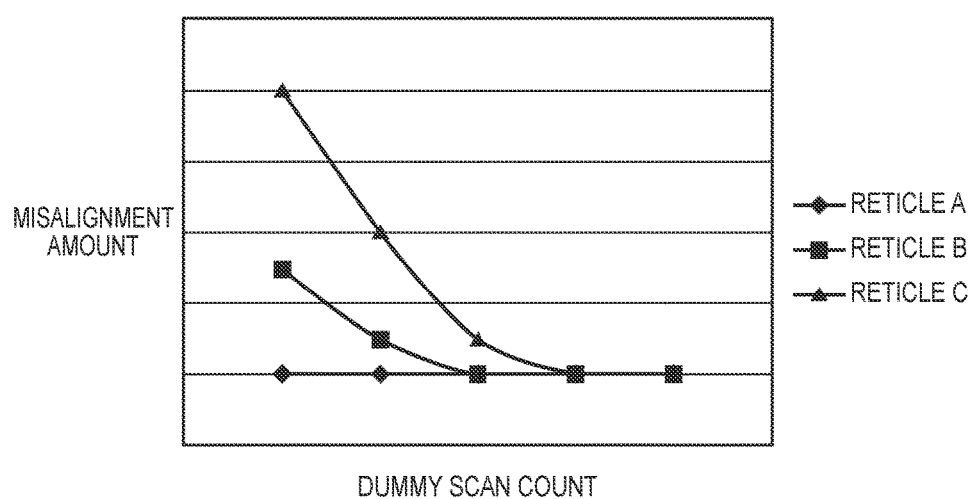
FIG. 4 is a graph showing an example of the relationship between a preliminary scan driving count and a misalignment amount for each substrate.

According to examinations, it is known that a preliminary scan driving count necessary to stabilize the coupling state between the original and the original holder varies depending on the type of the original, the environment of the holding mechanism of the original, and the like. For example, in an example shown in FIG. 4, in the case of reticle A, the misalignment amount is small from the early stage, and no preliminary scan driving (dummy scan) is necessary. To the contrary, in the case of reticle B, since there exists the misalignment amount at the time of mounting, which is not negligible, preliminary scan driving is necessary. In the case of reticle C, the misalignment amount at the time of mounting is larger than that for reticle B, and it is necessary to perform preliminary scan driving a larger number of times until the misalignment amount converges within an allowable range. The factors of this are considered to be the film structure and surface state of the original, the surface state of a pad for chucking the original, and the like. In actual device manufacturing, various originals can be used to cope with many kinds of products and a multilayered structure. Therefore, if the preliminary scan driving count is constant regardless of the original, such operation is redundant for the original which reaches the stable state early, thereby impairing the total productivity.

Figure 5:
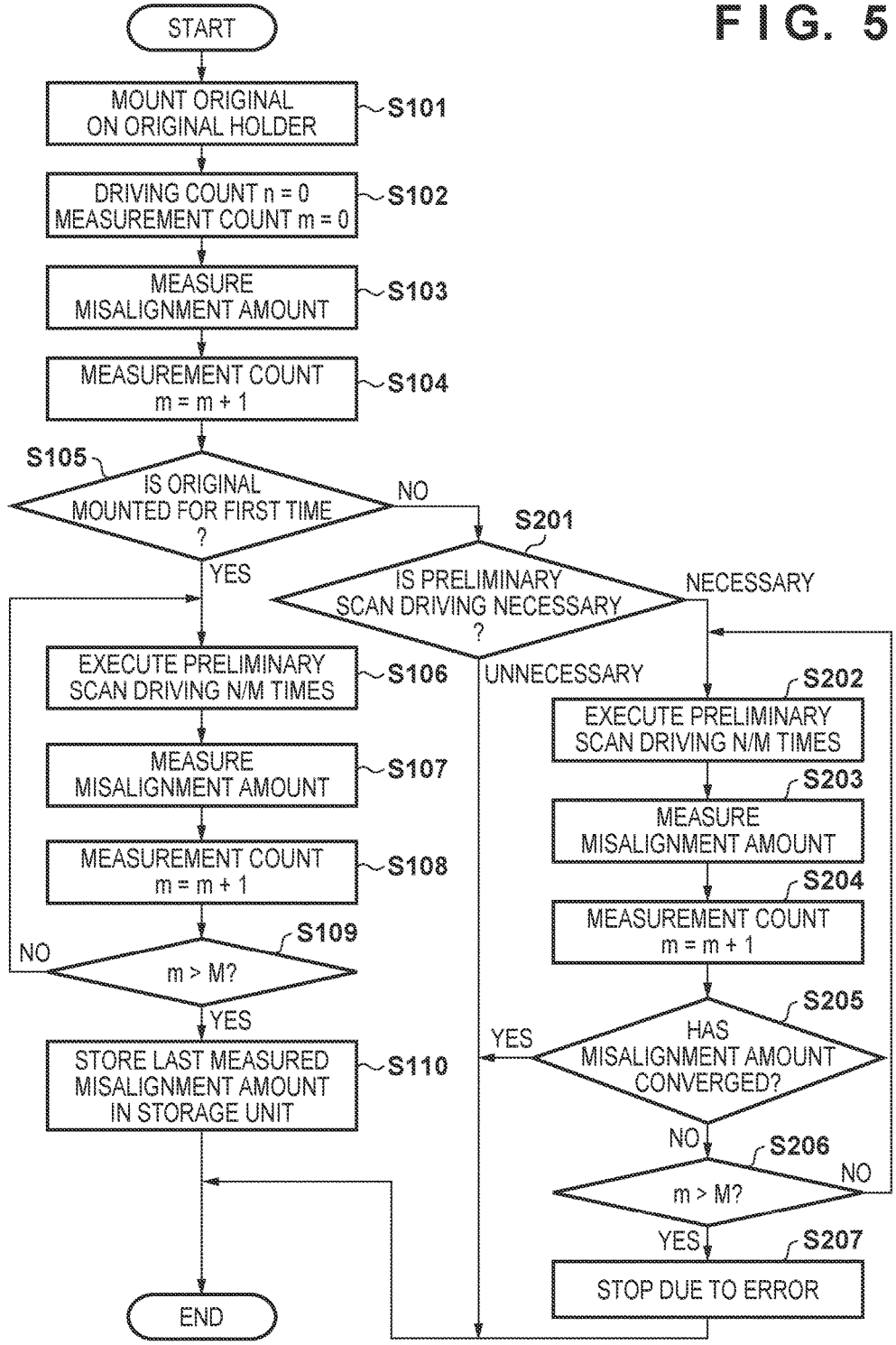
FIG. 5 is a flowchart illustrating the control procedure of preliminary scan driving according to the embodiment.

To solve this problem, in this embodiment, control is executed to perform preliminary scan driving the minimum number of times in accordance with the original. FIG. 5 is a flowchart illustrating the control procedure of preliminary scan driving executed by the controller 16. The original is mounted on the original holder 13 based on a control command from the controller 16 (step S101). More specifically, the original is conveyed by a conveying hand (not shown) and placed on the original holder 13. After that, the original is chucked and held by the original holder 13. Upon completion of mounting of the original, an accumulated count n of preliminary scan driving and a measurement count m of the misalignment amount are initialized to 0 (step S102). Next, the misalignment amount is measured using the original misalignment detector 17 (step S103). At this time, the value of the measurement count m is incremented (step S104).

By, for example, determining whether the measured value of the misalignment amount is stored in the storage unit 162, it is determined whether the exposure apparatus 100 mounts this original for the first time (step S105). If the exposure apparatus 100 mounts this original for the first time, the process advances to step S106; otherwise, the process advances to step S201.

In step S106, a set of preliminary scan driving operations is executed. The number of times preliminary scan driving is executed per set is obtained by dividing a predetermined total execution count N by a predetermined set count M. For example, when the total execution count N is 100 and the set count M is 5, the number of times preliminary scan driving is executed per set is given by N/M=20. At this time, as a profile of acceleration or a driving distance when performing preliminary scan driving, the same profile as that used for exposure or a different profile suitable for accelerating stabilization of the coupling state between the original and the original holder 13 may be used. After preliminary scan driving in step S106 ends, the misalignment amount is measured using the original misalignment detector 17 (step S107). Along with the measurement, the value of the measurement count m is incremented (step S108). It is then determined whether the measurement count m has exceeded the total set count M (step S109). If the measurement count m has not exceeded the total set count M, the process returns to step S106. In this way, M sets of preliminary scan driving operations and misalignment amount measurement operations are repeated. Upon completion of the M sets of preliminary scan driving operations, preliminary scan driving has been performed by the total execution count N (M×N/M) described above.

Figure 6:
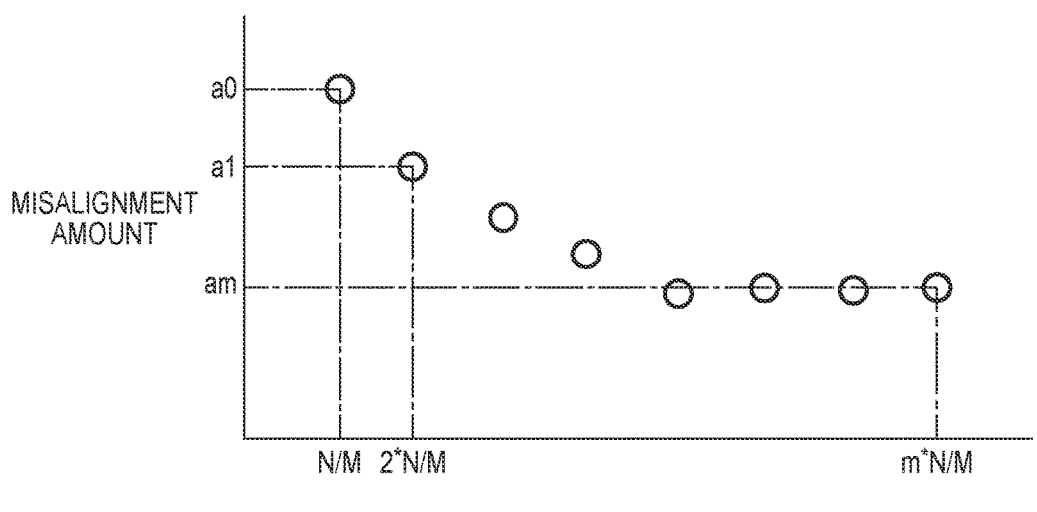
FIG. 6 is a graph showing an example of the relationship between the preliminary scan driving count and the misalignment amount.

During this processing, the misalignment amount gradually decreases to a0, a1, . . . , as shown in FIG. 6. It is estimated that the misalignment amount has converged to a predetermined convergence value when processing of performing preliminary scan driving by the total execution count N is complete. That is, the total execution count N is a predetermined count, which is enough for the misalignment amount to converge to the predetermined convergence value, when the original is mounted on the original holder 13 for the first time. In the example of FIG. 6, a misalignment amount am indicates the predetermined convergence value. After completion of the M sets of preliminary scan driving operations (YES in step S109), the controller 16 stores the last measured misalignment amount as a convergence value in the storage unit 162 (step S110). This convergence value may be added to a file in which original information such as a reticle structure and transmittance is described. This stores a convergence value for each original.

Note that in the above example, the total execution count N is divided into a predetermined number of sets, and the misalignment amount is measured for each set by the loop processing in steps S106 to S109. In this example, however, preliminary scan driving may be executed N times in step S106, and the misalignment amount may be measured only once after that.

If the original is not mounted on the original holder 13 for the first time, the process shifts from step S105 to step S201. In step S201, it is determined whether preliminary scan driving is necessary, by comparing the misalignment amount measured in step S103 with the convergence value stored in the storage unit 162. For example, let am be the convergence value set by reading it out from the storage unit 162, a0 be the misalignment amount measured in step S103, and TH be a threshold. Then, if inequality (1) below is satisfied, it is determined that the misalignment amount has converged to the convergence value am and no preliminary scan driving is necessary.

$$|am-a0| \leq TH \quad (1)$$

If it is determined that no preliminary scan driving is necessary, the process ends. On the other hand, if inequality (1) is not satisfied and it is determined that preliminary scan driving is necessary, preliminary scan driving is executed a plurality of times (step S202). After that, the misalignment amount is measured using the original misalignment detector 17 (step S203), and the value of the measurement count m is incremented (step S204). By rechecking whether inequality (1) is satisfied, it is determined whether the misalignment amount has converged to the predetermined convergence value (step S205). If inequality (1) is satisfied, it is determined that the misalignment amount has converged (YES in step S205), and the process ends. If inequality (1) is not satisfied, it is determined that the misalignment amount has not converged (NO in step S205). In this case, it is determined whether the measurement count m has exceeded the set count M (step S206). If the measurement count m has not exceeded the set count M, the process returns to step S202. The set of steps S202 to S206 is repeated M times at most. However, every time preliminary scan driving ends for each set, the misalignment amount is measured. If it is determined that the misalignment amount has converged to the convergence value, the controller 16 terminates preliminary scan driving.

If the misalignment amount has not converged to the predetermined convergence value while the set of steps S202 to S206 is repeatedly executed the predetermined number of times (YES in step S206), the adherence of a foreign substance to a chucking portion on the original or the original holder 13, the abnormality of the chucking pressure, or the like is considered. In this case, therefore, an error is output, for example, a warning notification is sent, thereby stopping the process due to the error (step S207).

According to the above control processing, useless preliminary scan driving which does not contribute to reduction of a mounting error is not performed. Thus, it is possible to reduce the mounting error while preventing the productivity from decreasing.

Note that in the above-described embodiment, convergence of the reference misalignment amount is determined using the difference absolute value between the upper limit value of the allowable range and the measured misalignment amount, as indicated by inequality (1). The present invention, however, is not limited to this. For example, the difference between continuous measured values may be calculated, and it may be determined that the misalignment amount has converged when the difference becomes smaller than a predetermined threshold. Alternatively, when a gradient obtained by differentiating between measured values at some points becomes smaller than a predetermined threshold, it may be determined that the misalignment amount has converged.

The above-described embodiment has explained reduction of a mounting error between the original (reticle) as an example of the article and the original holder for holding it in the exposure apparatus as an example of the lithography apparatus. However, those skilled in the art understand that the present invention is also applicable to reduction of a mounting error between the substrate (wafer) as another example of the article and the substrate holder for holding it. Furthermore, the present invention is applicable to a lithography apparatus other than the exposure apparatus. For example, in an imprint apparatus for performing pattern formation by bringing an original (mold) into contact with an imprint material on a substrate, the present invention is applicable to at least one of the mold and the substrate.

<Embodiment of Method of Manufacturing Article>

A method of manufacturing an article according to an embodiment of the present invention is suitable for manufacturing an article, for example, a microdevice such as a semiconductor device or an element having a microstructure. The method of manufacturing an article according to this embodiment includes a step of transferring the pattern of an original onto a substrate using the above-described lithography apparatus (an exposure apparatus, an imprint apparatus, a drawing apparatus, or the like), and a step of processing the substrate onto which the pattern has been transferred in the preceding step. This manufacturing method further includes other known steps (oxidation, deposition, vapor deposition, doping, planarization, etching, resist removal, dicing, bonding, packaging, and the like). The method of manufacturing the article according to this embodiment is advantageous in at least one of the performance, quality, productivity, and production cost of the article, as compared to conventional methods.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-069279, filed Mar. 30, 2016, which is hereby incorporated by reference herein in its entirety.

What is claimed is:

1. A lithography apparatus for performing pattern formation by transferring a pattern of an original onto a substrate, comprising:
   an original holder configured to hold and move the original;
   a measurement unit configured to measure a misalignment amount of the original with respect to the original holder; and
   a controller configured to control movement of the original holder,
   wherein the controller repeatedly performs preliminary driving for moving the original holder before performing the pattern formation, and controls the movement of the original holder so as to end the preliminary driving if the misalignment amount measured by the measurement unit converges to a predetermined convergence value while the preliminary driving is repeatedly performed.

2. The apparatus according to claim 1, wherein the controller repeats a set of an operation of executing the preliminary driving a plurality of times and an operation of determining, after processing of executing the preliminary driving the plurality of times is completed, whether the misalignment amount measured by the measurement unit has converged to the predetermined convergence value.

3. The apparatus according to claim 2, wherein if the misalignment amount measured by the measurement unit does not converge to the predetermined convergence value while the set is repeatedly executed a predetermined number of times, the controller outputs an error.

4. The apparatus according to claim 1, wherein if the original is mounted on the original holder for the first time, the controller repeatedly executes the preliminary driving a predetermined number of times enough for the misalignment amount to converge to the predetermined convergence value, and then sets, as the predetermined convergence value, the misalignment amount measured by the measurement unit.

5. The apparatus according to claim 1, wherein the lithography apparatus comprises an exposure apparatus configured to expose the substrate via the original and a projection optical system.

6. The apparatus according to claim 5, wherein
   the exposure apparatus comprises a scanning exposure apparatus configured to expose the substrate by scanning the original and the substrate with respect to the projection optical system, and
   the preliminary driving comprises preliminary scan driving for causing the original holder to reciprocate within a moving range of the original holder at the time of scanning exposure.

7. The apparatus according to claim 1, wherein the lithography apparatus comprises an imprint apparatus configured to perform the pattern formation by bringing the original into contact with an imprint material on the substrate.

8. A lithography apparatus for performing pattern formation on a substrate, comprising:
   a substrate holder configured to hold and move the substrate;
   a measurement unit configured to measure a misalignment amount of the substrate with respect to the substrate holder; and
   a controller configured to control movement of the substrate holder,
   wherein the controller repeatedly performs preliminary driving for moving the substrate holder before performing the pattern formation, and controls the movement of the substrate holder so as to end the preliminary driving if the misalignment amount measured by the measurement unit converges to a predetermined convergence value while the preliminary driving is repeatedly performed.

9. A control method for a lithography apparatus for performing pattern formation by transferring a pattern of an original held by an original holder onto a substrate, comprising:
   repeatedly performing preliminary driving for moving the original holder before performing the pattern formation;
   measuring a misalignment amount of the original with respect to the original holder while the preliminary driving is repeatedly performed; and
   ending the preliminary driving in response to the measured misalignment amount converging to a predetermined convergence value.

10. A control method for a lithography apparatus for performing pattern formation on a substrate held by a substrate holder, comprising:
   repeatedly performing preliminary driving for moving the substrate holder before performing the pattern formation;
   measuring a misalignment amount of the substrate with respect to the substrate holder while the preliminary driving is repeatedly performed; and ending the preliminary driving in response to the measured misalignment amount converging to a predetermined convergence value.

11. A method of manufacturing an article, comprising:

performing pattern formation by transferring a pattern of an original onto a substrate using a lithography apparatus;

processing the substrate on which the pattern has been formed in the performing; and manufacturing the article from the processed substrate, wherein the lithography apparatus includes an original holder configured to hold and move the original, a measurement unit configured to measure a misalignment amount of the original with respect to the original holder, and a controller configured to control movement of the original holder, and the controller repeatedly performs preliminary driving for moving the original holder before performing the pattern formation, and controls the movement of the original holder so as to end the preliminary driving if the misalignment amount measured by the measurement unit converges to a predetermined convergence value while the preliminary driving is repeatedly performed.

12. A method of manufacturing an article, comprising:

performing pattern formation by transferring a pattern of an original onto a substrate using a lithography apparatus;

processing the substrate on which the pattern has been formed in the performing; and manufacturing the article from the processed substrate, wherein the lithography apparatus includes a substrate holder configured to hold and move the substrate, a measurement unit configured to measure a misalignment amount of the substrate with respect to the substrate holder, and a controller configured to control movement of the substrate holder, and the controller repeatedly performs preliminary driving for moving the substrate holder before performing the pattern formation, and controls the movement of the substrate holder so as to end the preliminary driving if the misalignment amount measured by the measurement unit converges to a predetermined convergence value while the preliminary driving is repeatedly performed.

* * * * *